(12) United States Patent
Wu et al.

(10) Patent No.: US 6,683,660 B1
(45) Date of Patent: Jan. 27, 2004

(54) ACTIVE MATRIX LIQUID CRYSTAL DISPLAY AND METHOD OF MAKING THE SAME

(75) Inventors: Biing-Seng Wu, Tainan (TW);
Chin-Lung Ting, Tainan (TW);
Hiroyuki Furuhashi, Tainan (TW)

(73) Assignee: Chi Mei Optoelectronics Corp. (TW)

( * ) Notice: Subject to any disclaimer, the term of this patent is extended or adjusted under 35 U.S.C. 154(b) by 303 days.

(21) Appl. No.: 09/705,231

(22) Filed: Nov. 1, 2000

(30) Foreign Application Priority Data

May 5, 2000 (TW) ........................................ 89108716 A (51) Int. Cl.[7] .............................................. G02F 1/136
(52) U.S. Cl. ........................................... 349/43; 349/42
(58) Field of Search ............................. 349/43, 42, 139

(56) References Cited

U.S. PATENT DOCUMENTS 5,867,233 A * 2/1999 Tanaka ........................ 349/43
5,990,998 A * 11/1999 Park et al. ................. 349/139

* cited by examiner

Primary Examiner—Tarifur R. Chowdury
Assistant Examiner—Thoi V. Duong
(74) Attorney, Agent, or Firm—Martine & Penilla, LLP (57) ABSTRACT

A TFT LCD and the method of making the same are provided to prevent short circuits occurred between metal lines and transparent pixel electrodes. An insulating layer is provided to overlay the entire metal layer except the intersection areas for forming contact windows. Then, the transparent conductive layer is provided to form pixel electrodes and interconnection lines. Thus, even transparent conductive layer is not etched clearly and forming residuals, the residuals will not cause short circuits between the metal lines and transparent pixel electrodes. Eventually, the production yield rate can be increased. Moreover, a second metal layer is deposed under the transparent conductive layer to reduce the resistance of the interconnection lines.

3 Claims, 12 Drawing Sheets

ACTIVE MATRIX LIQUID CRYSTAL DISPLAY AND METHOD OF MAKING THE SAME

BACKGROUND OF THE INVENTION

A. Field of the Invention

The present invention relates to a method of fabricating a liquid crystal display (LCD), especially to a method of fabricating a liquid crystal display which can effectively prevent the short circuit occurred between the pixel electrodes and the metal lines.

B. Description of the Prior Art

Figure 1:
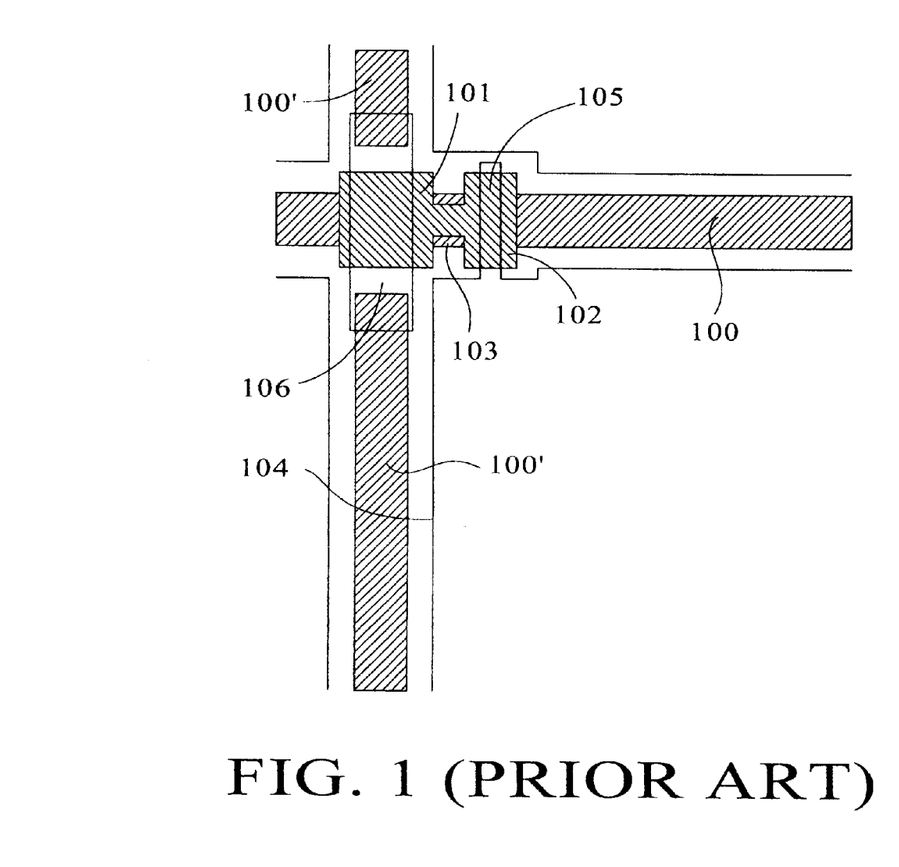
FIG. 1 is a schematic diagram showing the structure of a conventional TFT LCD.
Figure 2:
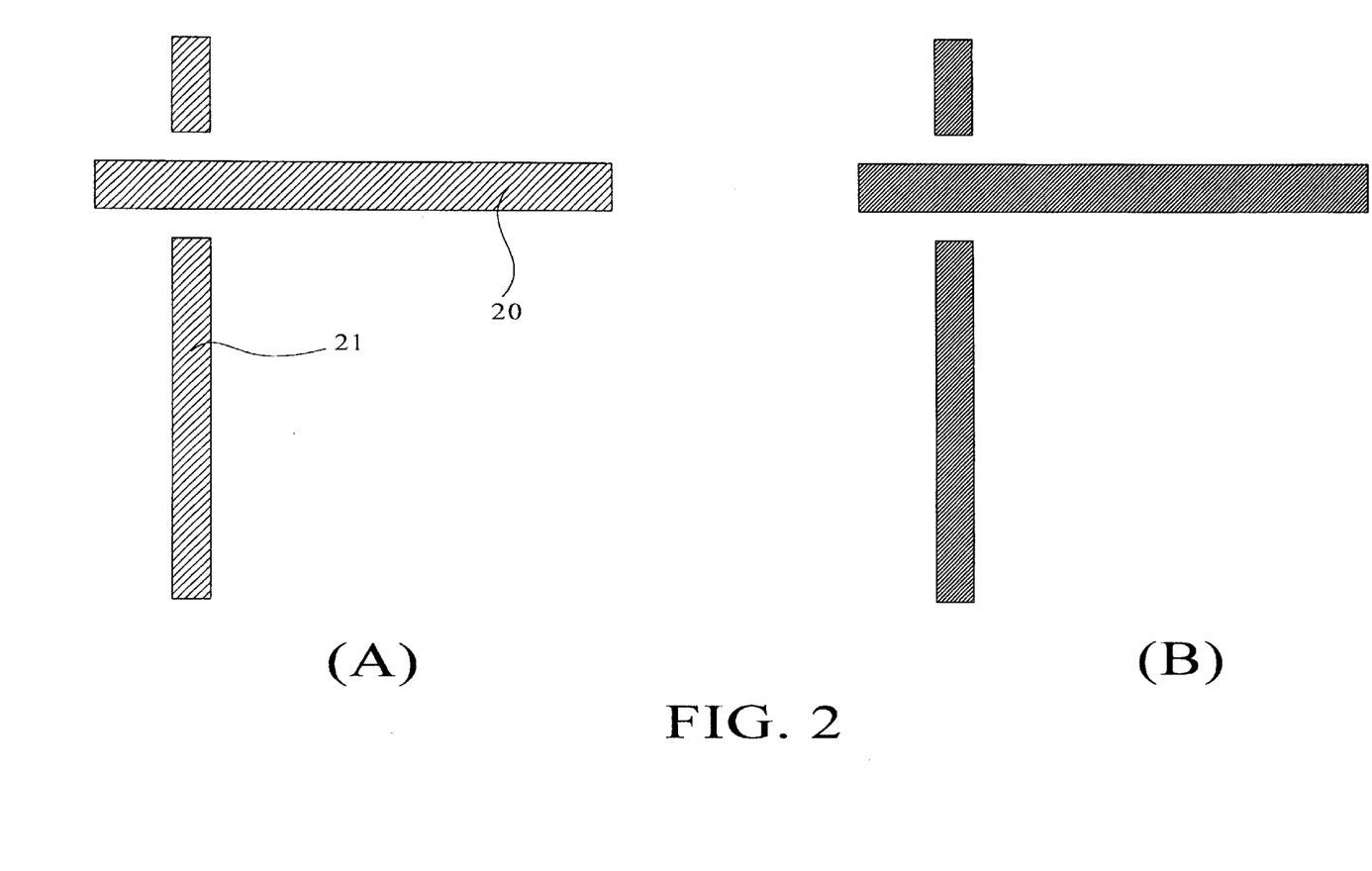
FIG. 2(A) is a schematic diagram showing the structure defined by the first mask as illustrated in FIG. 2(B).
Figure 3:
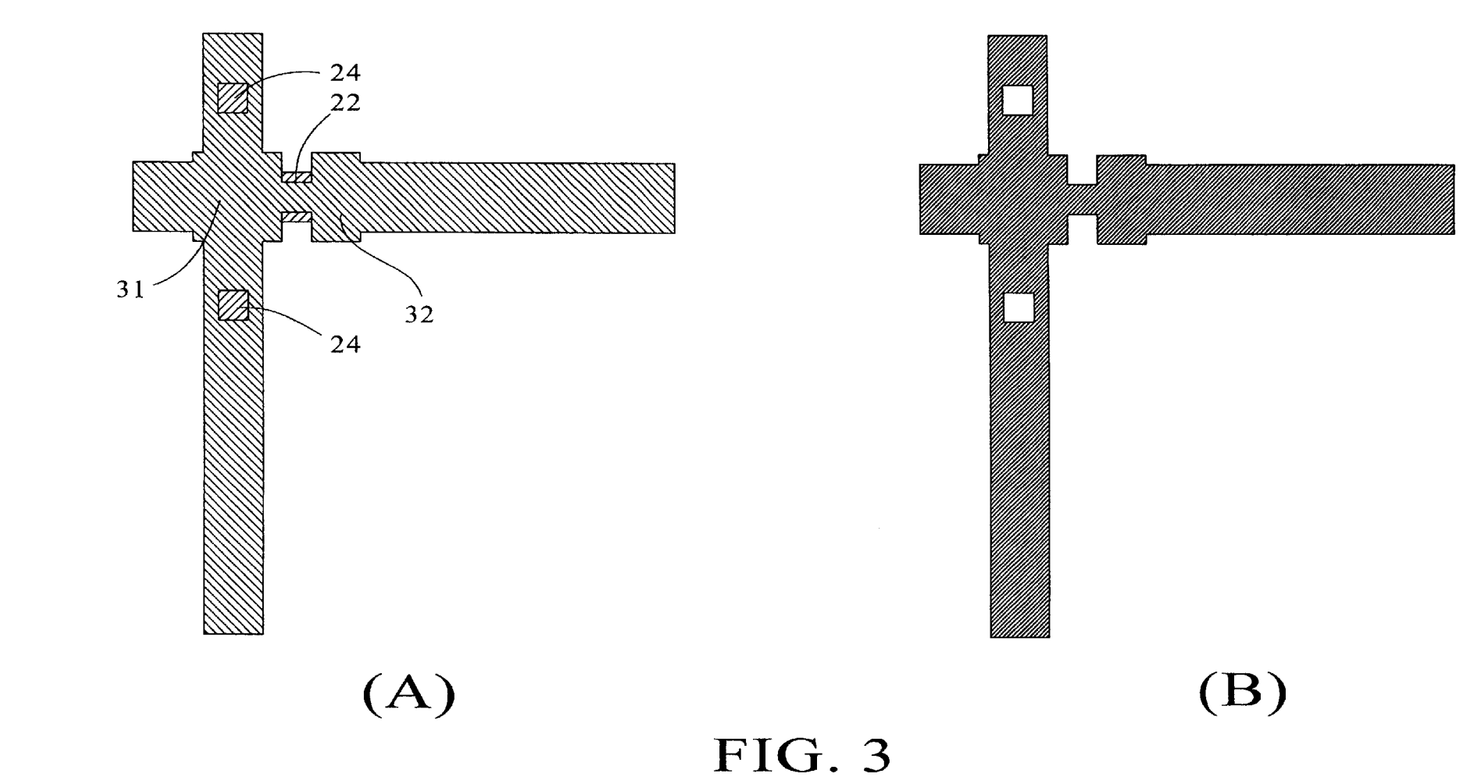
FIG. 3(A) is a schematic diagram showing the structure defined by the second mask as illustrated in FIG. 3(B).
Figure 4:
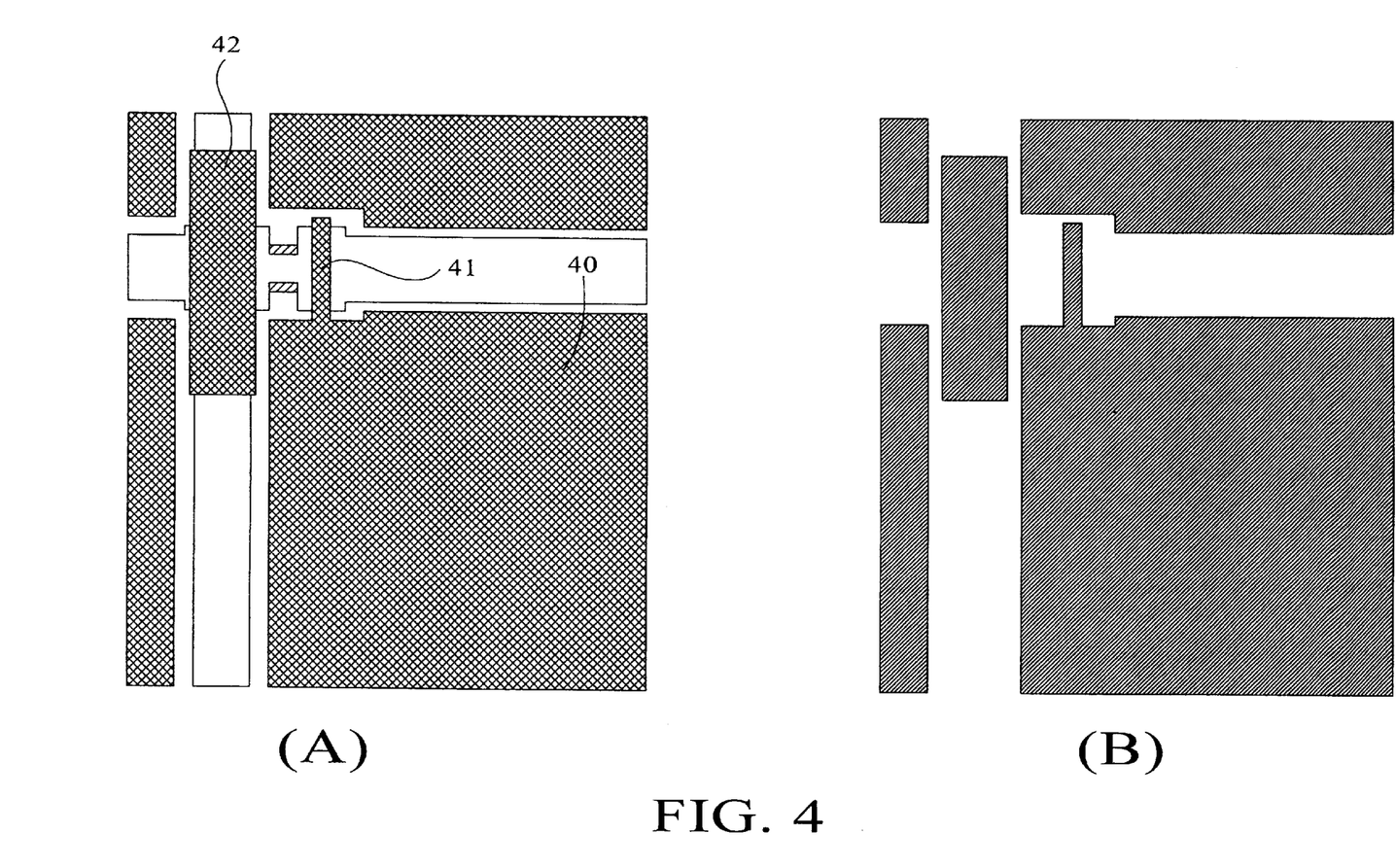
FIG. 4(A) is a schematic diagram showing the structure defined by the third mask as illustrated in FIG. 4(B).
Figure 5:
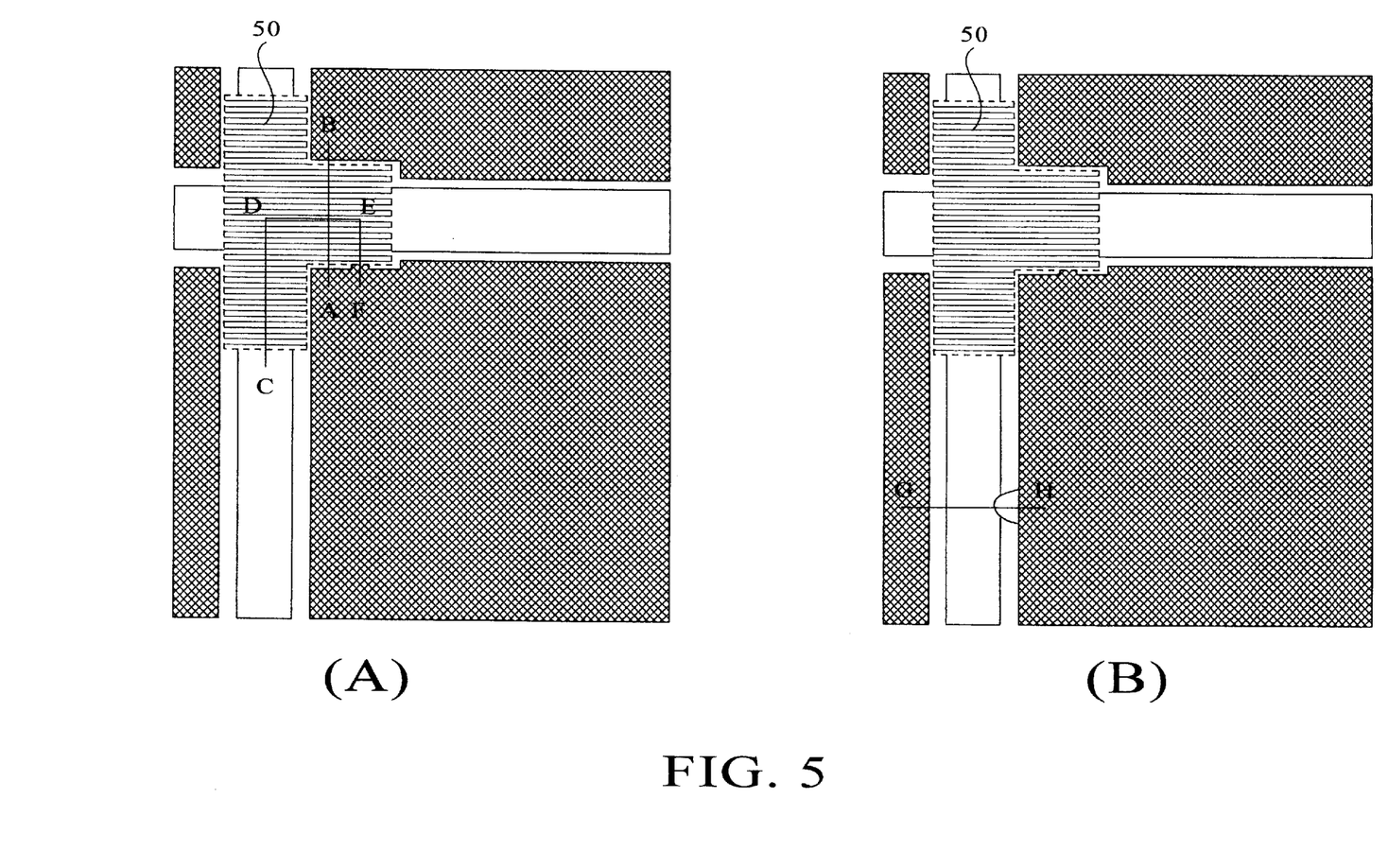
FIG. 5(A) is a schematic diagram showing the structure defined by a forth mask according to the first preferred embodiment of the present invention.
FIG. 5(B) is a schematic diagram showing the structure having residuals of transparent conductive layer according to the first preferred embodiment of the present invention.
Figure 6:
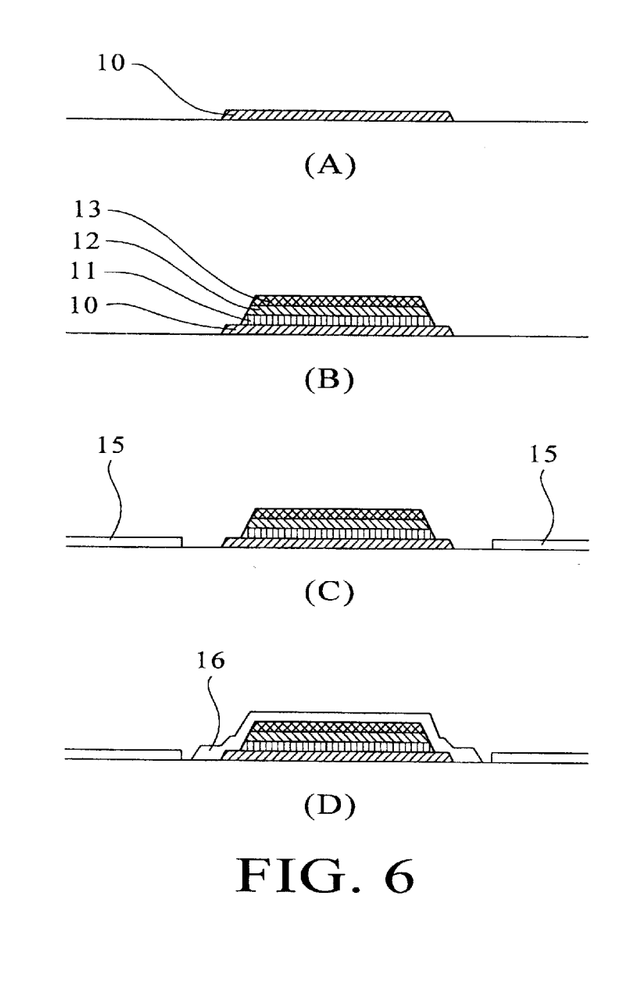
Figure 7:
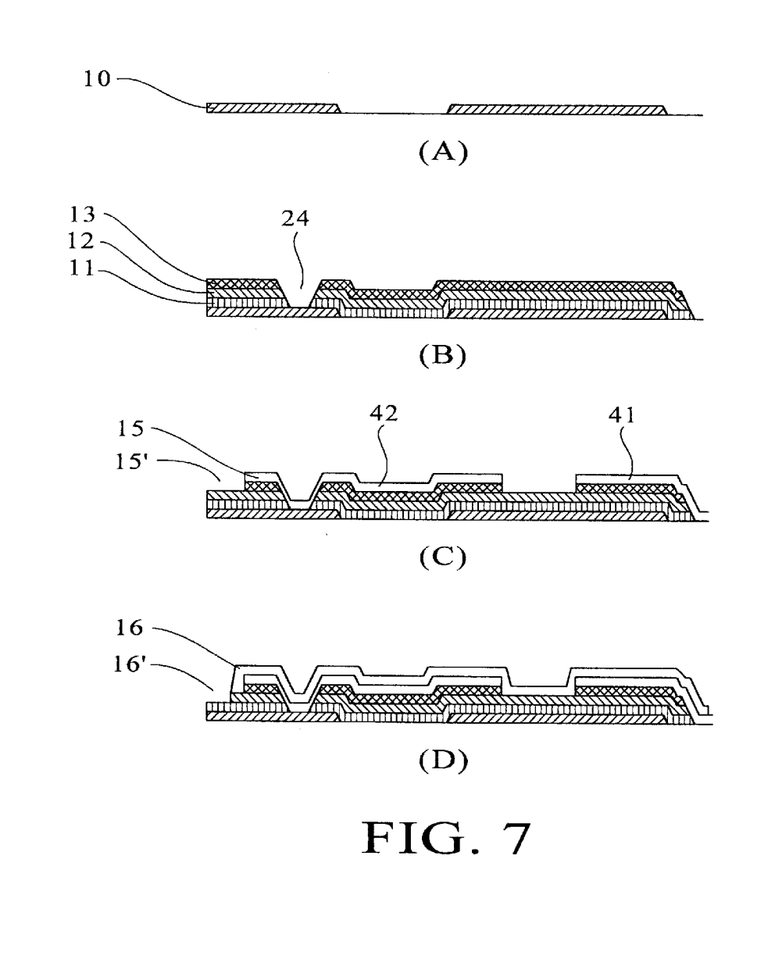
Figure 8:
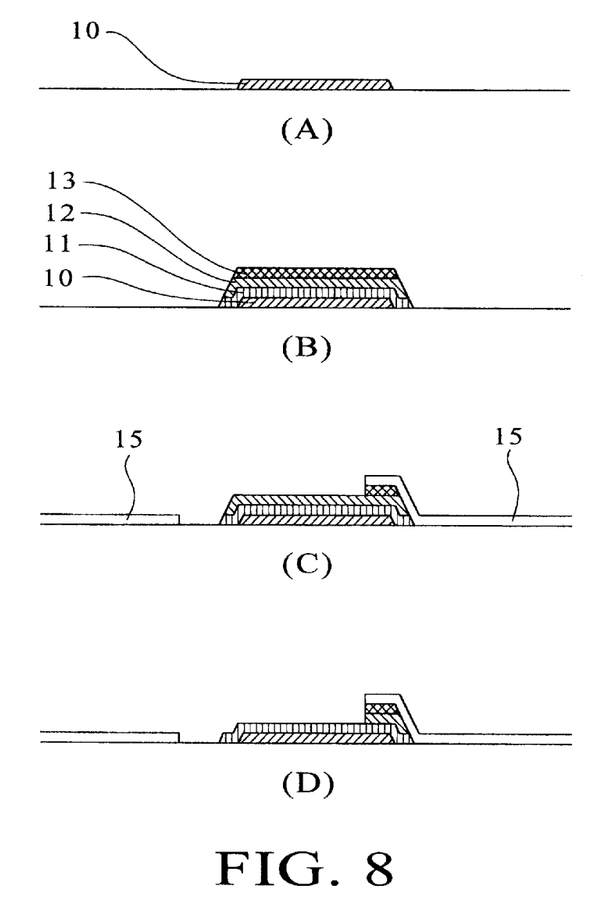
Figure 9:
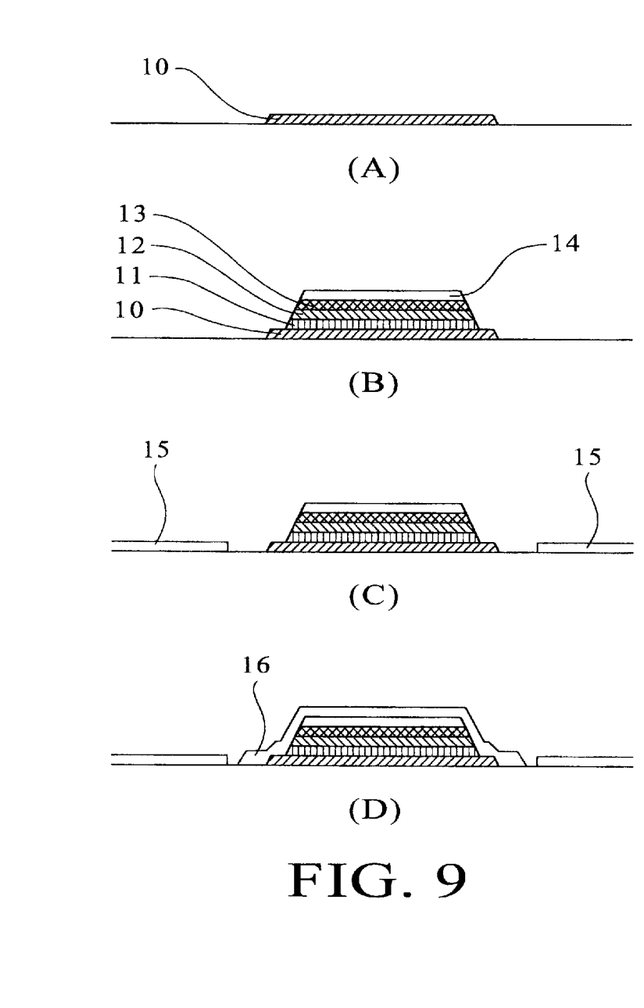
Figure 10:
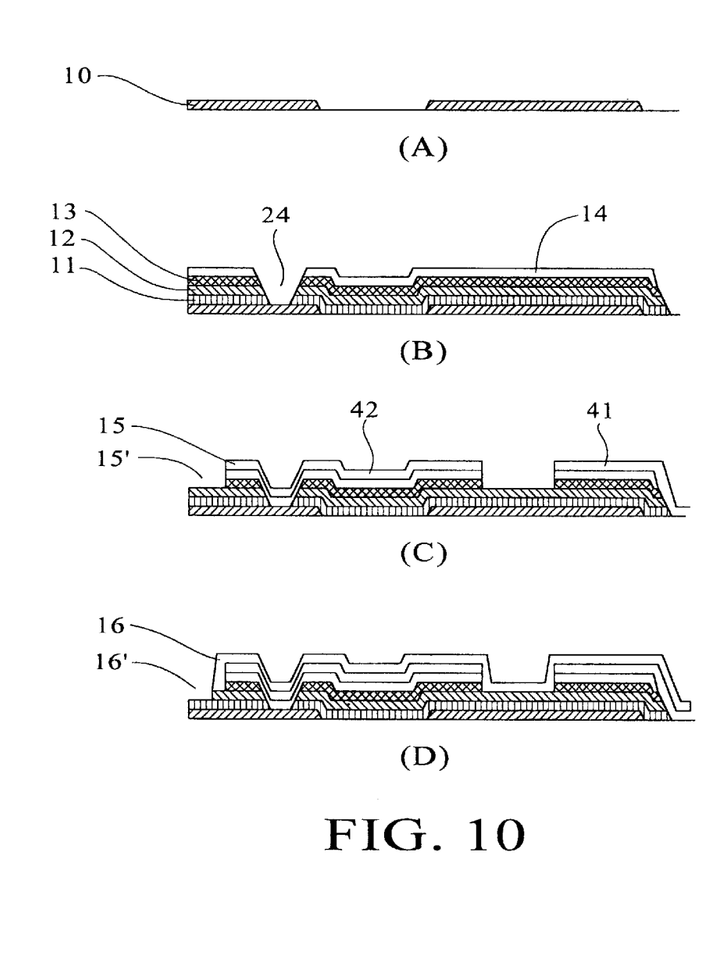

The conventional method for manufacturing a thin film transistor (TFT) LCD usually involves 6 to 9 photolithographic steps. U.S. Pat. No. 5,346,833 disclosed a simplified method for fabricating a TFT LCD in which only three photolithographic steps are required, so as to improve the yield rate and reduce the cost. Referring to FIG. 1, it shows the method of the '833 patent. The first mask is provided for patterning metal lines on a glass substrate. The first fabrication process includes the steps of depositing a metal layer on a glass substrate and using a conventional photolithographic method to pattern the scan line 100 and the data line 100'.

The second mask is provided for isolating a TFT mesa. The second fabrication process includes the steps of successively depositing an isolating layer, an amorphous semiconductor layer and a heavily-doped semiconductor layer on the metal layer and using a conventional photolithographic method to etch out the TFT me sa to form a source area 101, a drain area 102, and a channel 103, respectively.

The third mask is provided to pattern the pixel electrode. The third fabrication process includes the steps of depositing a transparent conductive layer and using a conventional photolithographic method to simultaneously pattern the pixel electrode 104, the interconnection line 106 of data line 100' and the drain electrode 105.

However, the problem of the aforementioned method of '833 patent is that an insulating layer is formed only on the intersection point of the data line 100' and scan line 100. After the transparent conductive layer has been deposited and etched, it is easy to cause a short circuit between the pixel electrode 104 and the metal lines if the transparent conduction layer was not etched clearly. Eventually, the short circuit problem will affect the functions of the pixel electrodes and inevitably reduce the production yield of the TFT LCD.

Moreover, the data lines 100' are connected by interconnection lines 106 which is usually formed by the transparent conductive layer. Since the transparent conductive layer is usually formed by Indium Tin Oxide (ITO) with a resistance higher than the resistance of the metal lines, so the overall resistance of the data lines 100' will be increased. As a result, it causes a major degradation of the gray scale of the LCD.

SUMMARY OF THE INVENTION

Accordingly, an object of the invention is to provide a TFT LCD and method for fabricating such a TFT LCD which can prevent short circuits occurred between metal lines and pixel electrodes even the transparent conductive layer was not etched clearly.

Another object of the present invention is to provide a TFT LCD and method for fabricating such a TFT LCD which can reduces the resistance of the interconnection lines by forming a second metal layer under the interconnection lines.

Accordingly, the method of the invention includes the steps of:

(a) depositing a metal layer on a transparent substrate;

(b) patterning the metal layer as a plurality of vertical metal lines and a plurality of horizontal metal lines without connected with the vertical metal lines by using a first mask;

(c) successively depositing an insulating layer, an amorphous semiconductor layer, and a heavily-doped semiconductor layer on the transparent substrate;

(d) patterning the insulating layer, the amorphous semiconductor layer and the heavily-doped semiconductor layer as a pattern to cover the plurality of vertical metal lines and the plurality of horizontal metal lines but leaving a plurality of contact windows on the metal lines near the unconnected ends by using a second mask;

(e) etching the heavily-doped semiconductor layer, the amorphous semiconductor layer, and the insulating layer;

(f) depositing a transparent conductive layer on the transparent substrate;

(g) patterning the transparent conductive layer as pixel electrodes, and interconnection lines for connecting same line of disconnected metal lines via the contact windows by using a third mask;

(h) etching the transparent conductive layer and the heavily-doped semiconductor layer;

(i) depositing a passivation layer on the transparent substrate;

(j) patterning the passivation layer as passivation areas by using a fourth mask; and (k) etching the passivation layer and the amorphous semiconductor layer.

BRIEF DESCRIPTION OF THE DRAWINGS

These and other objects and advantages of the present invention will become apparent by reference to the following description and accompanying drawings wherein:

FIGS. 6(A)~6(D) are cross-sectional views schematically showing the structures along the A-B lines of FIG. 5(A).

FIGS. 7(A)~7(D) are cross-sectional views schematically showing the structures along the C-D-E-F lines of FIG. 5(A).

FIGS. 8(A)~8(D) are cross-sectional views schematically showing the tructures along the G-H lines of FIG. 5(B).

FIGS. 9(A)~9(D) are cross-sectional views schematically showing the structures along the A-B lines of FIG. 5(A) and particularly having an additional second metal layer on the heavily-doped semiconductor layer.

FIGS. 10(A)~10(D) are cross-sectional views schematically showing the structures along the C-D-E-F lines of FIG. 5(A) and particularly having an additional second metal layer on the heavily-doped semiconductor layer.

FIGS. 14(A)~14(D) are cross-sectional views schematically showing the structures along M-N lines of FIG. 13(A).

FIGS. 15(A)~15(D) are cross-sectional views schematically showing the structures along I-J lines of FIG. 13(A).

DETAILED DESCRIPTION OF THE PREFERRED EMBODIMENTS

According to a first preferred embodiment of the present invention, a method for fabricating a TFT LCD using four photolithographic steps is disclosed. With reference to FIGS. 2~8, the method is described in details as follows:

The first fabrication process includes the following steps. First, deposit a metal layer 10 on a transparent substrate using material such as aluminum (Al) or chromium (Cr). Second, pattern the metal layer 10 using the mask illustrated in FIG. 2(B) as the resultant structure illustrated in FIG. 2(A). Third, remove the photoresist. FIG. 2(A) shows a top-view of the intersection area of a data line 21 and a scan line 20. It should be understood that the data lines 21 are disconnected at the intersection area in this embodiment. It is also possible to form disconnected scan line 20.

The second fabrication process includes the following steps. First, successively deposit an insulating layer 11, an amorphous semiconductor layer 12, and a heavily-doped semiconductor layer 13 on the transparent substrate. The insulating layer 11 can be formed by silicon nitride (SiN). The amorphous semiconductor layer 12 can be formed by amorphous silicon (a–Si). The heavily-doped semiconductor layer 13 can be formed by heavily-doped silicon (n+Si). Second, use the mask as illustrated in FIG. 3(B) to define contact windows on the disconnected ends of data line 21. Third, etch the heavily-doped semiconductor layer 13, the amorphous semiconductor layer 12, and the insulating layer 11. Finally, remove the photoresist. The resultant structure is illustrated in FIG. 3(A). The mask of FIG. 3(B) defines contact windows 24 near an intersection area by covering the areas of a scan line 20, and data lines 21. The mask also defines a channel 22 near an intersection area on the scan line 20 for connecting a source electrode area 31 and a drain electrode area 32.

The third fabrication process includes the following steps. First, deposit a transparent conductive layer 15 such as Indium Tin Oxide (ITO) on the transparent substrate. Second, use the mask as illustrated in FIG. 4(B) to define interconnection lines 42 for connecting the data line 21 via two contact windows 24. Third, etch the transparent conductive layer 15 and the heavily-doped semiconductor layer 13. Finally, remove the photoresist. The resultant structure is illustrated in FIG. 4(A). The mask of FIG. 4(B) defines the interconnection lines 42, the pixel electrode 40, and the drain electrode 41 extending from the pixel electrode 40. The interconnection lines 42 are formed on the source electrode area 31 for connecting the data lines 21 via the contact window 24. Besides, the drain electrode 41 is formed on the drain electrode area 32.

The fourth fabrication process includes the following steps. First, deposit a passivation layer 16 on the transparent substrate. Second, use a mask to define a passivation area for the TFT mesa as illustrated in FIG. 5(A). Third, etch the passivation layer 16 and the amorphous semiconductor layer 12. Finally, remove the photoresist.

Referring to FIGS. 6(A)~6(D) and FIGS. 7(A)~7(D), they illustrate the method of making the TFT LCD) according to the first embodiment of the invention. FIGS. 6(A)~6(D) are cross-sectional views of the channel 22 for illustrating the resultant structures after each fabrication process along the A-B lines. FIGS. 7(A)~7(D) show the resultant structures after each fabrication process along C-D-E-F lines, that is, along the data line 21, the scan line 20, the drain electrode 41, and the pixel electrode 40.

As illustrated in FIG. 6(A), after the first fabrication process, there is only a metal layer 10 formed on the channel 22. As illustrated in FIG. 7(A), a gap is formed between the data line 21 and the scan line 20. In other words, the data line 21 and the scan line 20 are disconnected at the intersection area.

After the second fabrication process, the insulating layer 11, the amorphous semiconductor layer 12, and heavily-doped semiconductor layer 13 are formed on the channel 22 as illustrated in FIG. 6(B). The width of the insulating layer 11, the amorphous semiconductor layer 12, and heavily-doped semiconductor layer 13 are made incrementally narrower than the width of the metal layer 10 so as to take the advantage of the metal layer 10 for blocking the light incidents away. At the same time, as illustrated in FIG. 7(B), the insulating layer 11, the amorphous semiconductor layer 12, and the heavily-doped semiconductor layer 13 are also formed on the data line 21 and the scan lines 20. Moreover, a contact window 24 is also formed on the data line 21.

After the third fabrication process, a resultant structure is formed as illustrated in FIG. 6C. The transparent conductive layer 15 is formed on the opposite sides of the channel 22. On the other hand, as shown in FIG. 7(C), the interconnection lines 42 are formed by the transparent conductive layer 15 for conducting the data lines 21 by traversing the scan line 20. In addition, a drain electrode 41 is also formed on the scan line 20. Moreover, a gap is formed between the interconnection line 42 and the drain electrode 41. Furthermore, during this process, the portion of the heavily-doped semiconductor layer 13 not covered by the transparent conductive layer 15 must be etched as shown in the area 15' of FIG. 7(C).

After the fourth fabrication process, a resultant structure is formed as illustrated in FIG. 6(D), in which a passivation layer 16 is formed on the channel 22. Meanwhile, as shown in FIG. 7(D), a passivation layer 16 is also formed on the interconnection line 42 and the drain electrode 41. During this process, the portion of the amorphous semiconductor layer 12 not covered by the passivation layer 16 must be etched as illustrated in the area 16' of FIG. 7(D), so as to form a TFT.

FIGS. 8(A)~8(D) show the cross-sectional views along the G-H lines of FIG. 5(B) after each fabrication process. A metal layer 10 is formed on the transparent substrate after the first fabrication process, as shown in FIG. 8(A). Then, the insulating layer 11, the amorphous semiconductor layer 12, and the heavily-doped semiconductor layer 13 are formed after the second fabrication process. The insulating layer 11 is formed to overlap the entire data line 21 and scan line 20, as shown in FIG. 8(B). A transparent conductive layer 15 is formed and the heavily-doped semiconductor layer 13 is etched after the third fabrication process, as shown in FIG. 8(C). The passivation layer 16 is formed and then the amorphous semiconductor layer 12 is etched after the fourth fabrication process, as shown in FIG. 8(D). Thus, the data line 21 and the scan line 20 are both covered by the insulating layer 11 and become insulated even when the residuals of the transparent conductive layer 15 remain on the data line 21 or the scan line 20 during the etching step. So, the short circuit will not occur between the data line 21(or a scan line) and the pixel electrode 40 because of the insulating layer 11. Eventually, the residuals of the transparent conductive layer 15 remained in the previous fabrication process cannot directly contact with the metal layer 10. Accordingly, the method, and the LCD of the invention can highly improve production yield.

Refer to FIGS. 9(A)~9(D) and FIGS. 10(A)~10(D) for showing that a second metal layer 14 is in addition formed on the heavily-doped semiconductor layer 13 during the second fabrication process. And, during the third fabrication process, the second metal layer 14 is etched away. The purpose of adding the second metal layer 14 is to contact with the in terconnection line 42 for reducing the resistance of the interconnection line 42.

The second preferred embodiment of the present invention is similar to the first preferred embodiment. The difference is only in the layout of the TFT. The first fabrication process for the second preferred embodiment is the same as the first fabrication process of the first embodiment. So, refer to the description of FIGS. 2(A)~2(B) for the details.

Figure 11:
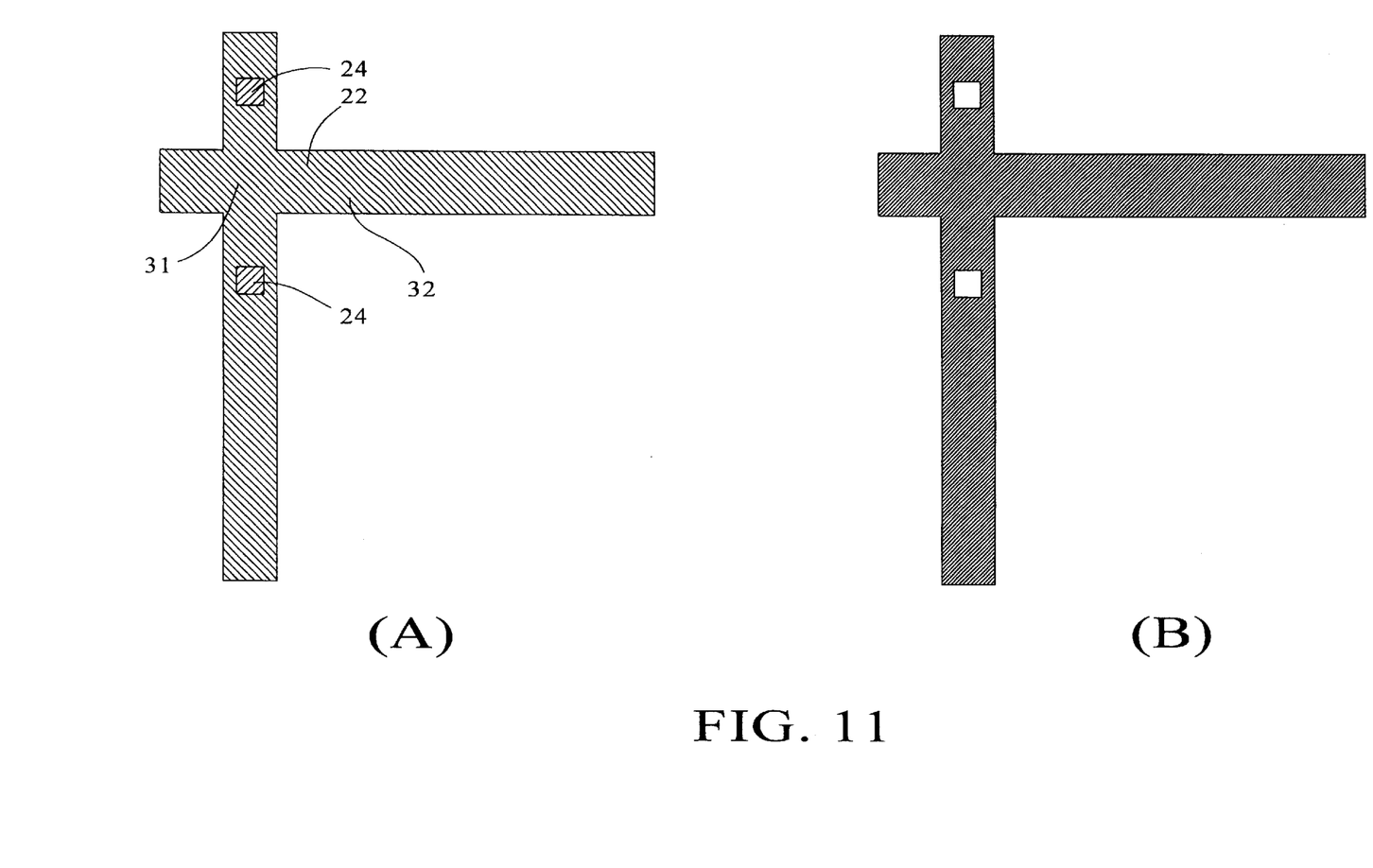
FIG. 11(A) is a schematic diagram showing the structure defined by the second mask as illustrated in FIG. 11(B) according to the second preferred embodiment of the present invention.

The second fabrication process includes the following steps. First, successively deposit an insulating layer 11, an amorphous semiconductor layer 12, and a heavily-doped semiconductor layer 13 on the transparent substrate. Second, use the mask as illustrated in FIG. 11(B) to form a resultant pattern as illustrated in FIG. 11(A). Third, etch the heavily-doped semiconductor layer 13, the amorphous semiconductor layer 12, and the insulating layer 11. Finally, remove the photoresist. The mask illustrated in FIG. 11(B) defines the pattern to cover the areas of the scan line 20 and the data lines 21 and forms contact windows 24 at the end portions of data lines 21.

Figure 12:
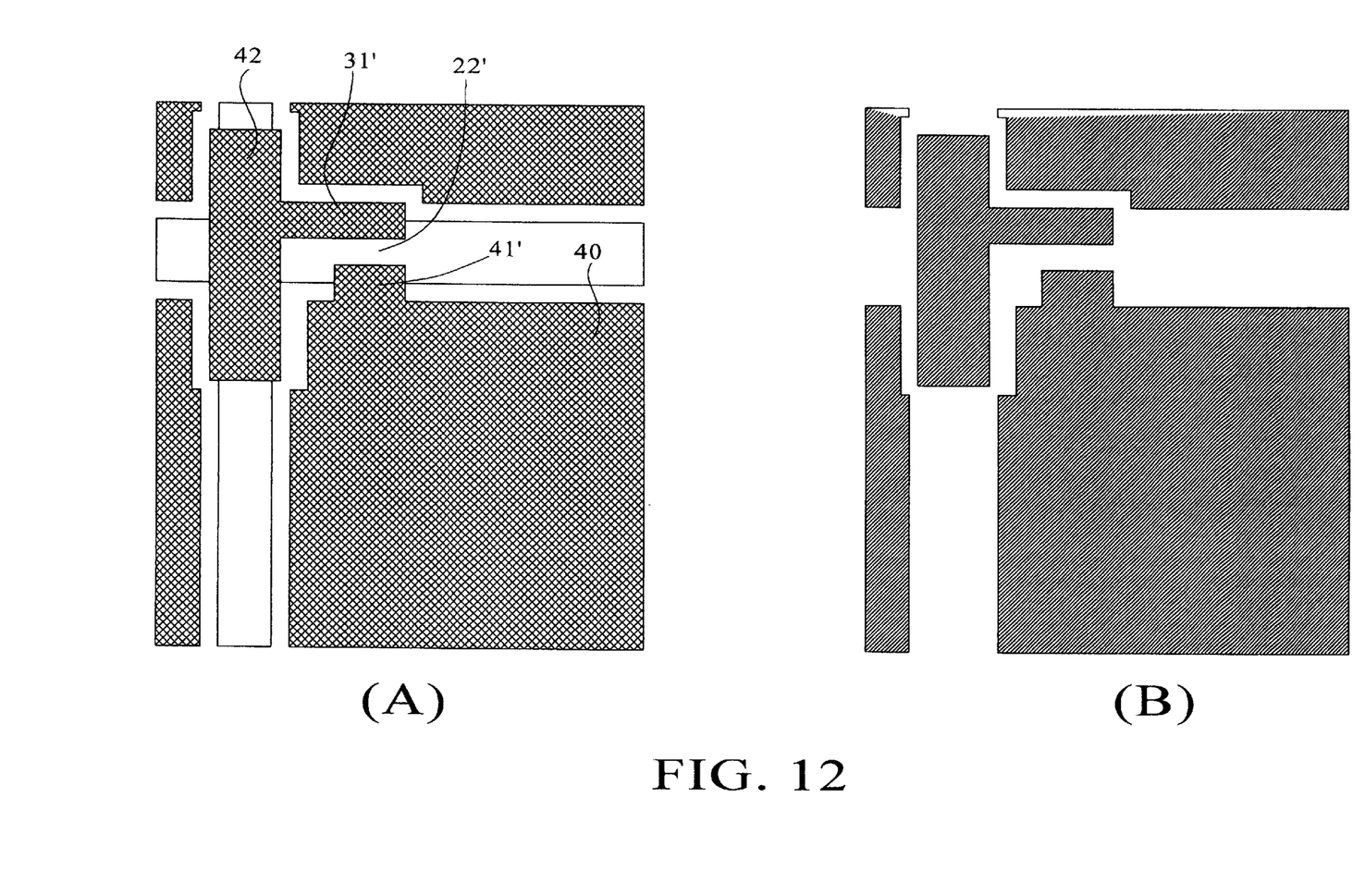
FIG. 12(A) is a schematic diagram showing the pattern formed after the third mask as illustrated in FIG. 12(B) according to the second preferred embodiment of the present invention.

The third fabrication process includes the following steps. First, deposit a transparent conductive layer 15 on the transparent substrate. Second, use the mask as illustrated in FIG. 12(B) to form a resultant structure as illustrated in FIG. 12(A). Third, etch the transparent conductive layer 15 and the heavily-doped semiconductor layer 13. Finally, remove the photoresist. The structure formed after this process includes the pixel electrode 40, the drain electrode 41' extending from the pixel electrode 40, the interconnection line 42 and the source electrode 31' extending from the interconnection line 42, and a channel 22' formed between the source electrode 31' and the drain electrode 41'. The interconnection line 42 traverses the scan line 20 for connecting the data lines 21 via the contact windows 24.

Figure 13:
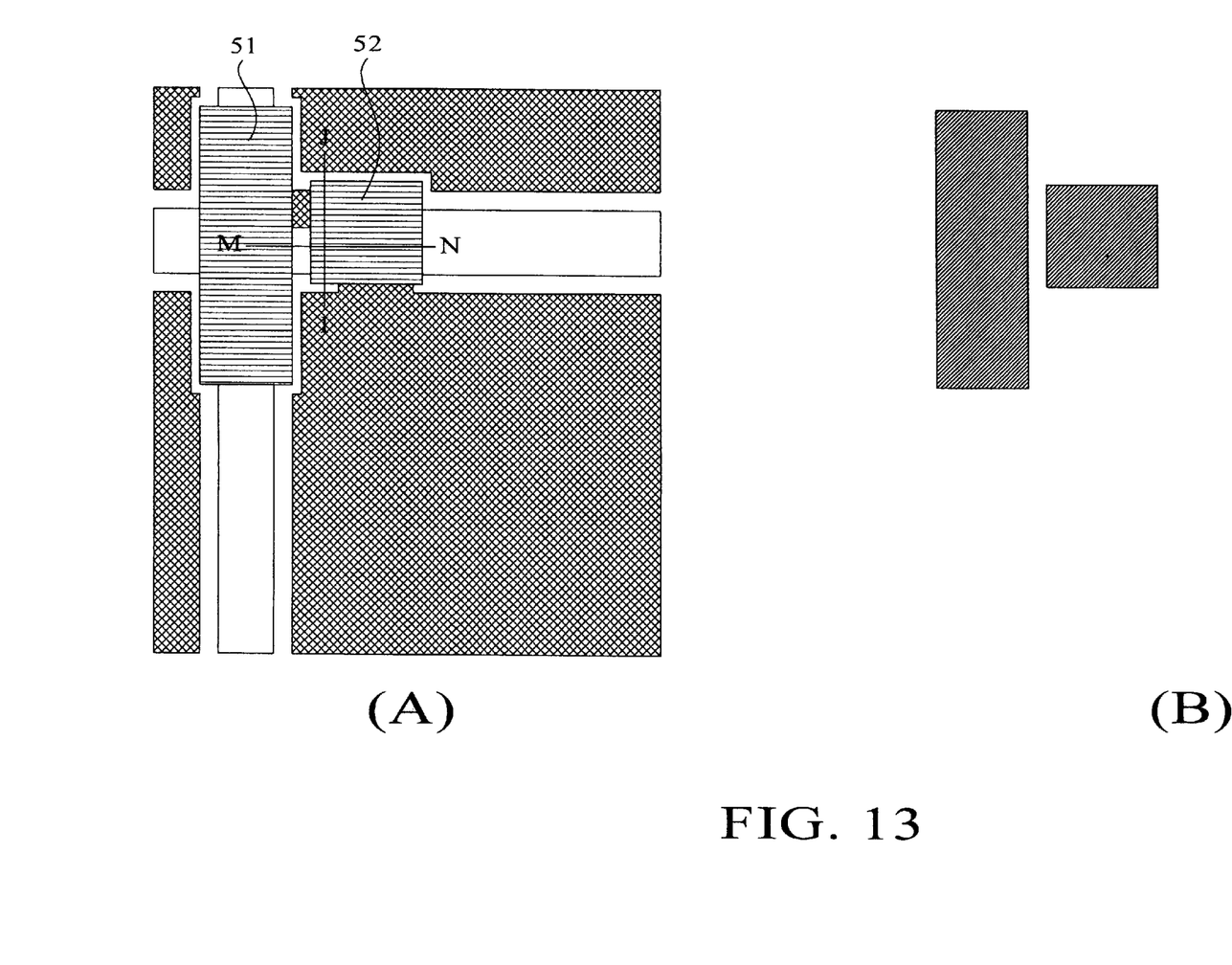
FIG. 13(A) is a schematic diagram showing the structure defined by the fourth mask of FIG. 13(B) according to the second preferred embodiment of the present invention.
Figure 14:
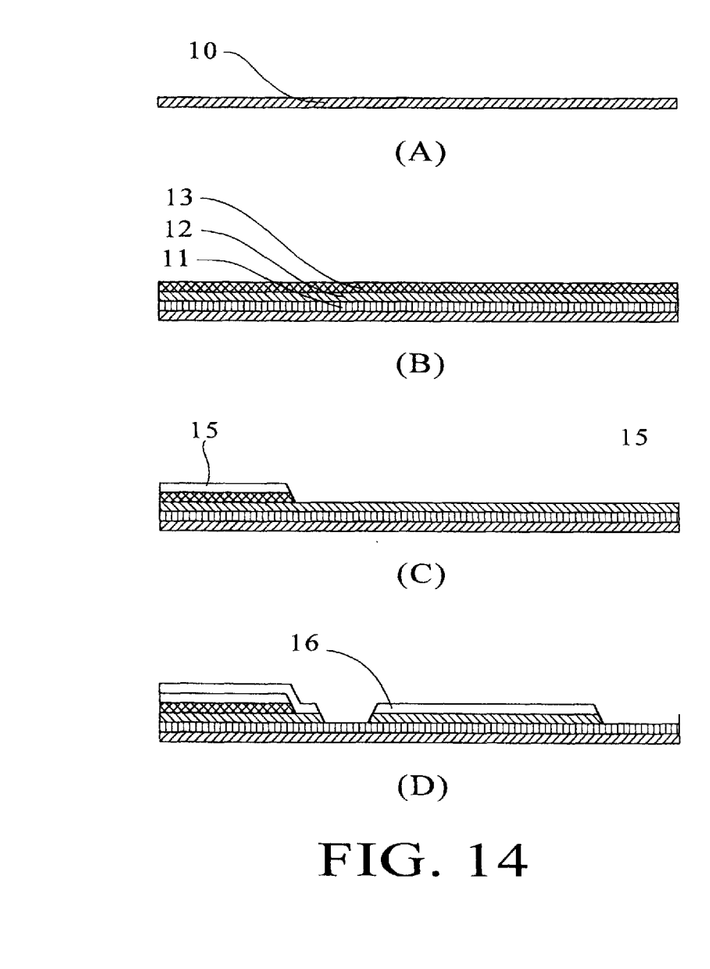
Figure 15:
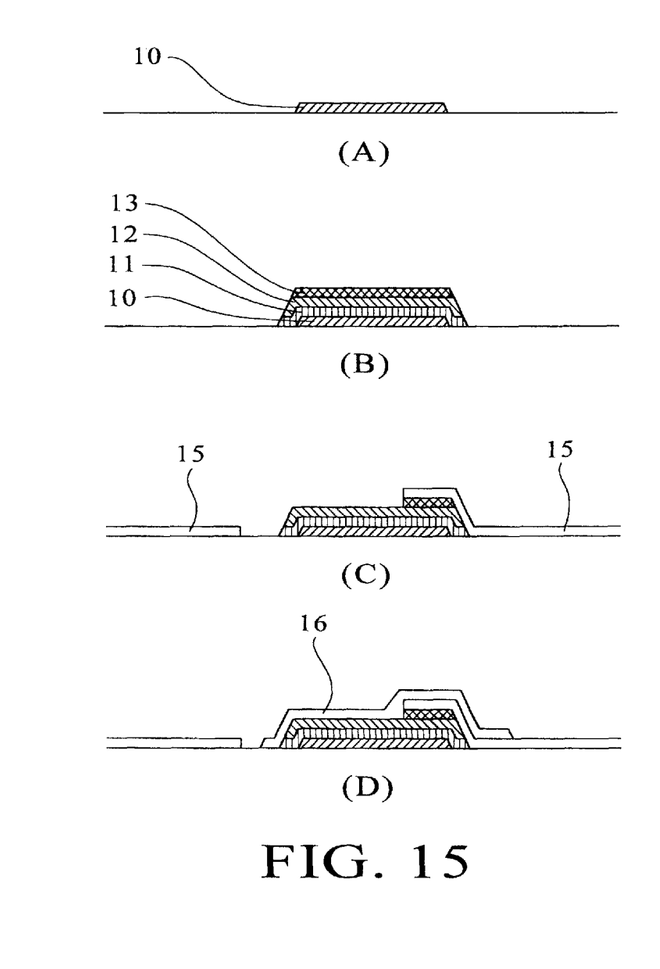

The fourth fabrication process includes the following steps. First, form a passivation layer 16 on the transparent substrate. Second, use the mask illustrated in FIG. 13(B) for forming a resultant structure as illustrated in FIG. 13(A). Third, etch the passivation layer 16 and the amorphous semiconductor layer 12. Finally, remove the photoresist. The structure formed after this process includes the first passivation area 51 for overlapping the interconnection line 42, and the second passivation area 52 for overlapping the drain electrode 41' and the source electrode 31'.

Referring to FIGS. 14(A)~14(D) and FIGS. 15(A)~15(D), they show the fabrication method of the second embodiment. FIGS. 14(A)~14(D) show the cross-sectional views of the structure along M-N lines of FIG. 13(A) formed after each fabrication process. FIGS. 15(A)~15(D) illustrate the cross-sectional views of the structure along I-J lines of FIG. 13(A) formed after each fabrication process.

Moreover, to reduce the resistance of the interconnection line 42 formed by the transparent conductive layer 15, a second metal layer can also be formed on the heavily-doped semiconductor layer 13.

According to the first and second preferred embodiments of the present invention, the data lines and the scan lines are fully covered by an insulating layer. As a result, the occurrence of short circuits can be prevented even the residuals of the transparent conducting layer accidentally remained in the previous fabrication process. Moreover, an additional metal layer can be deposited between the heavily-doped semiconductor layer and the transparent conductive layer. By combining the second metal layer and the transparent conductive layer, the resistance of the interconnection lines can be further reduced.

It should be understood that various alternatives to the structures described herein may be employed in practicing the present invention. It is intended that the following claims define the invention and that the structure within the scope of these claims and their equivalents be covered thereby.

What is claimed is:

1. A liquid crystal display comprising a transparent substrate; a plurality of continuous metal lines and a plurality of discontinuous metal lines on said transparent substrate, wherein said plurality of discontinuous metal lines are substantially perpendicular to said continuous metal lines and disconnected with said continuous metal lines; thin film transistors at the intersections of said continuous metal lines and said discontinuous metal lines; a plurality of transparent electrodes; an insulating layer on said continuous metal lines and discontinuous metal lines with contact windows defined through the insulating layer, wherein said contact windows are positioned on said discontinuous metal lines near said continuous metal lines; and a plurality of interconnection lines for connecting said discontinuous metal lines via said contact windows and above said continuous lines, the liquid crystal display being characterized in that both of the continuous metal lines and the discontinuous metal lines are hermetically sealed by the insulating layer in all directions except for the contact windows.

2. The liquid crystal display as claimed in claim 1, further comprises a passivation layer above said interconnection lines for protecting said interconnection lines.

3. The liquid crystal display as claimed in claim 1, further comprises a second metal layer under said interconnection lines.

* * * * *